(12) United States Patent
Kirihata et al.

(10) Patent No.: US 9,053,889 B2
(45) Date of Patent: Jun. 9, 2015

(54) ELECTRONIC FUSE CELL AND ARRAY

(71) Applicant: International Business Machines Corporation, Armonk, NY (US)

(72) Inventors: Toshiaki Kirihata, Poughkeepsie, NY (US); Phil C. Paone, Rochester, MN (US); Vimal R. Patel, Rochester, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/784,980

(22) Filed: Mar. 5, 2013

(65) Prior Publication Data

US 2014/0253220 A1    Sep. 11, 2014

(51) Int. Cl.
*H01H 37/76* (2006.01)
*H01H 85/00* (2006.01)
*H01H 85/05* (2006.01)

(52) U.S. Cl.
CPC ..................................... *H01H 85/05* (2013.01)

(58) Field of Classification Search
CPC ...... G11C 17/18; G11C 17/16; G11C 29/785; H01L 23/5256; H01L 23/5252
USPC .................................. 327/51, 525; 365/225.7
See application file for complete search history.

(56) References Cited

U.S. PATENT DOCUMENTS

| | | | |
|---|---|---|---|
| 5,862,087 A * | 1/1999 | Lee | 365/200 |
| 6,426,668 B1 | 7/2002 | Morrish et al. | |
| 6,489,832 B1 * | 12/2002 | Kim et al. | 327/525 |
| 6,762,918 B2 | 7/2004 | Voldman | |
| 7,551,415 B2 * | 6/2009 | Tsai et al. | 361/56 |
| 7,729,188 B2 | 6/2010 | Aipperspach et al. | |
| 7,764,531 B2 | 7/2010 | Aipperspach et al. | |
| 7,936,582 B1 | 5/2011 | Zhou et al. | |
| 8,081,524 B2 * | 12/2011 | Park | 365/189.09 |
| 8,432,759 B2 * | 4/2013 | Hsu et al. | 365/201 |
| 2006/0203592 A1 * | 9/2006 | Uvieghara | 365/225.7 |
| 2008/0169861 A1 * | 7/2008 | Inoue | 327/525 |
| 2008/0316789 A1 * | 12/2008 | Fredeman et al. | 365/96 |
| 2009/0224323 A1 | 9/2009 | Im et al. | |
| 2010/0127757 A1 * | 5/2010 | Huang | 327/525 |
| 2011/0002176 A1 * | 1/2011 | Chang | 365/189.05 |
| 2012/0268195 A1 | 10/2012 | Erickson et al. | |

FOREIGN PATENT DOCUMENTS

KR    1020100124506 A    11/2010

OTHER PUBLICATIONS

Liao et al., "State Sensing System for Efuse Memory", filed Jun. 28, 2012, U.S. Appl. No. 13/535,802.

* cited by examiner

*Primary Examiner* — Quan Tra
(74) *Attorney, Agent, or Firm* — Richard A. Wilhelm; Robert R. Williams

(57) ABSTRACT

Embodiments may include an eFuse cell. The eFuse cell may include an eFuse having a first end and a second end. A blowFET has a first source/drain area, a second source/drain area, and a first gate. The first source/drain area is coupled to the second end of the eFuse, the second source/drain area is coupled to ground, and the first gate is coupled to a first node. The eFuse cell includes a senseFET having a third source/drain area, a fourth source/drain area, and a second gate. The second gate is coupled to the first node, and the third source/drain area is coupled to a second node. The second node is coupled to an operation signal and the second end of the eFuse. The eFuse cell includes a select eFuse logic element having an input to receive a select eFuse signal and an output coupled to the first node.

15 Claims, 6 Drawing Sheets

ELECTRONIC FUSE CELL AND ARRAY

FIELD

The present invention relates generally to the data processing field, and more particularly, relates to sensing the logical state of electronic fuses (eFuses).

BACKGROUND

Electronic fuses (eFuses) are currently used to configure elements after the silicon masking and fabrication process in integrated circuits. EFuses are non-volatile storage elements that include either an antifuse, which is a programmable element that provides an initial high resistance and when blown provides a selective low resistance or short circuit; or a fuse, which is a programmable element that provides an initial low resistance and when blown provides a selective high resistance or open circuit. These fuses typically are used to configure circuits for customization or to correct silicon manufacturing defects and increase manufacturing yield. In very large scale integrated circuits, it is common to have fuses, such as eFuses, that can be programmed for various reasons. These reasons include invoking redundant elements in memory arrays for repairing failing locations or programming identification information.

SUMMARY

Embodiments may include an eFuse cell apparatus and a design structure of an eFuse cell. The eFuse cell may include an eFuse having a first end and a second end, and a first resistance when in an unblown state and a second resistance when in a blown state. A blowFET having a first source/drain area, a second source/drain area, and a first gate may be included. The first source/drain area is coupled to the second end of the eFuse, the second source/drain area is coupled to ground, and the first gate is coupled to a first node. The eFuse cell includes a senseFET having a third source/drain area, a fourth source/drain area, and a second gate. The second gate is coupled to the first node, the third source/drain area is coupled to a second node, and the fourth source/drain area signals a sense signal. The second node is coupled to an operation signal and the second end of the eFuse. The eFuse cell includes a select eFuse logic element having an input to receive a select eFuse signal and an output coupled to the first node.

In another embodiment, an eFuse cell array on a semiconductor chip is described. The eFuse cell array may include an eFuse cell described previously. The eFuse cell array also includes a first bitline coupled to the fourth source/drain area. A first sensing node of a sense amplifier is coupled to the first bitline. A second bitline is coupled to a second sensing node of the sense amplifier. A first pull-up resistor is coupled between a positive voltage supply rail and a first sensing node of the sense amplifier. A second pull-up resistor is coupled between a positive voltage supply rail the second sensing node of the sense amplifier. A respective reference resistor is coupled to the first bitline and the second bitline.

In yet another embodiment, an exemplary eFuse cell is described. The eFuse cell may include an eFuse having a first resistance in an unblown state and a second resistance in a blown state. The eFuse cell may include a first switch coupling one end of the eFuse to a voltage source when the eFuse cell is selected, and a second switch coupling a second end of the eFuse to a bitline when the eFuse cell is selected. When selected the eFuse cell is configured to pass a sense current through the eFuse and the first switch, the second switch allows the bitline to sample the voltage drop across the eFuse with a DC current on the bitline that is less than the sense current.

DETAILED DESCRIPTION

Figure 1:
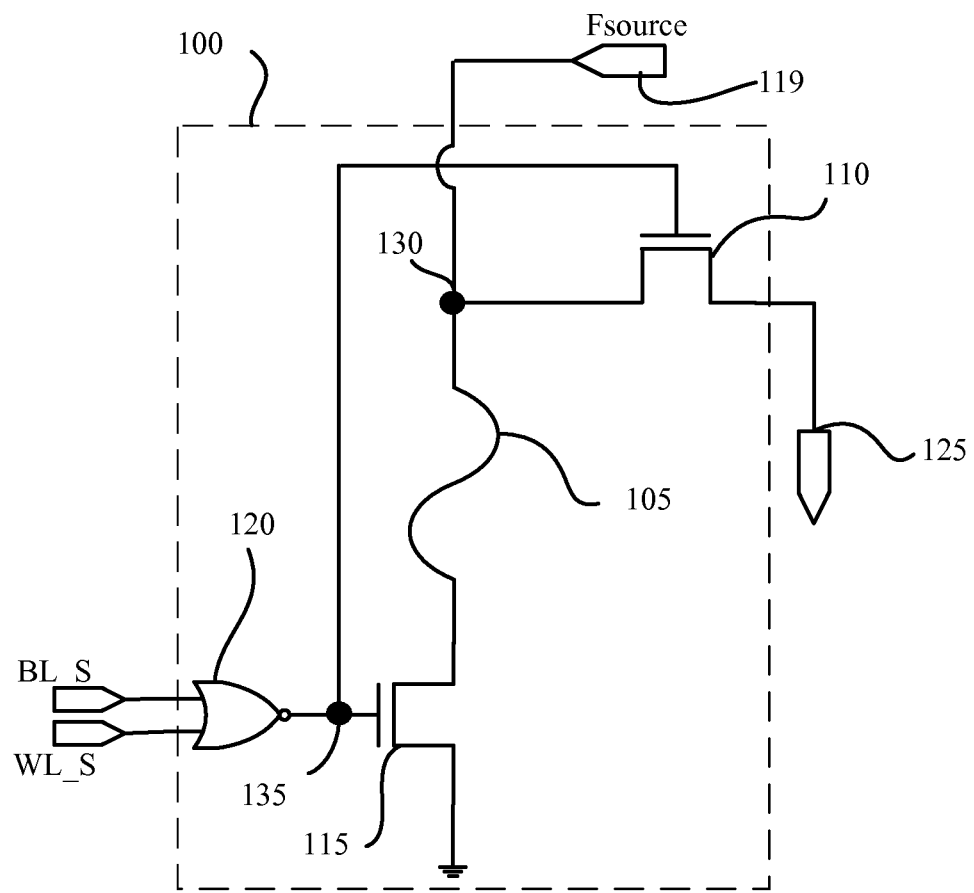
FIG. 1 is a schematic diagram of an eFuse cell, according to an embodiment.

Embodiments herein provide for an eFuse cell and eFuse cell array for indirectly sensing the state of an eFuse. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of this invention as claimed. The same numbers may be used in the Figures and the Detailed Description to refer to the same devices, parts, components, steps, operations, and the like.

In electronics, an eFuse is a technology that allows for the dynamic real-time reprogramming of circuits. Generally speaking, circuit logic is 'etched' or 'hard-coded' onto a semiconductor device and cannot be changed after the device has finished being manufactured. By incorporating an eFuse (or more realistically, a number of individual eFuses), a semiconductor device manufacturer may allow for the circuits on a device to change while the device is in operation.

Unlike most fuses, eFuses are not true open circuits when blown but maintain a very high resistance. For example, a blown eFuse may have a resistance of approximately 5 kiloohms. With the very high resistance, blown eFuses can be distinguished from unblown eFuses which may have only about 100 ohms resistance in a particular technology. When an eFuse is blown, the final resistance of the eFuse depends upon how well electromigration has occurred. How well electromigration occurs depends upon the amount of voltage across the eFuse and the amount of current through the eFuse. Due to process, voltage, and current variation, an eFuse may not blow correctly. An incorrectly blown eFuse usually results in a resistance, which is lower than expected. Lower resistance of a blown eFuse is a reliability concern. This lower resistance causes a problem in the ability to accurately sense whether an eFuse is blown or not by a sense amplifier. Furthermore, sense amplifiers have a region of uncertainty of several hundred ohms in their detection of the resistance of the eFuses due to threshold voltage (Vt) variation. This region of uncertainty may lead to false positives when detecting unblown and blown eFuses.

An issue for a traditional architecture of eFuse cells and eFuse cell arrays is that bitline resistance impacts the blow and sense operation due to the IR drop induced during these operations when using the bitline to perform them. Traditional eFuse array architectures have a high bitline resistance, which may require a large field effect transistor (FET) for blowing the eFuse or high programming voltages. The presence of high bitline resistance may lead to a less reliable blowing and sensing of the eFuse. EFuse resistance is measured by running a first current through the eFuse and a second current through a reference resistance. The voltage drop across the eFuse and the voltage drop across the reference resistance are compared. If the eFuse is blown incorrectly and the eFuse being tested is located further down the bitline, which means more bitline resistance, then the sense amplifier may not be able to compare the reference resistance and the eFuse resistance correctly in determining the state of the eFuse. Embodiments, herein, propose an eFuse cell and eFuse cell array architecture that minimizes the effects of IR drop due to high bitline resistance. A sense operation may indicate a voltage drop over the eFuse and the bitline samples the voltage drop over the eFuse during a sense operation with less or essentially no DC current on the bitline minimizing the effects of IR drop due to bitline resistance.

Referring to FIG. 1, a circuit diagram of an eFuse cell 100 is illustrated, according to an embodiment. The eFuse cell 100 may include an eFuse 105, a senseFET 110, a blowFET 115, and an eFuse select logic 120. The eFuse 105 may have a first resistance when blown and a second resistance when unblown. The unblown state first resistance may be 100 ohms and the blown state second resistance may be 5 kilo-ohms as one example; however, other resistances are contemplated. Alternatively, eFuse 105 may be an antifuse, which is a programmable element that provides an initial high resistance and when blown provides a selective low resistance or short circuit.

The eFuse 105 may have a first end and a second end. The blowFET 115 may have a first gate, first source/drain area, and a second source/drain area. The blowFET may be any switch and may be referred to as a first switch The senseFET 110 may have a second gate, third source/drain area, and a fourth source/drain area. The senseFET 110 may be any switch and may be referred to as second switch. The senseFET 110 and blowFET 115 may be nFETs though pFETs may be considered. For the purpose of the explanation, the senseFET 110 and blowFET 115 will be treated as nFETs. The eFuse select logic 120 may have a first input, a second input, and an output. The eFuse select logic 120 may be a NOR gate, however other logic gates may be considered.

Figure 2:
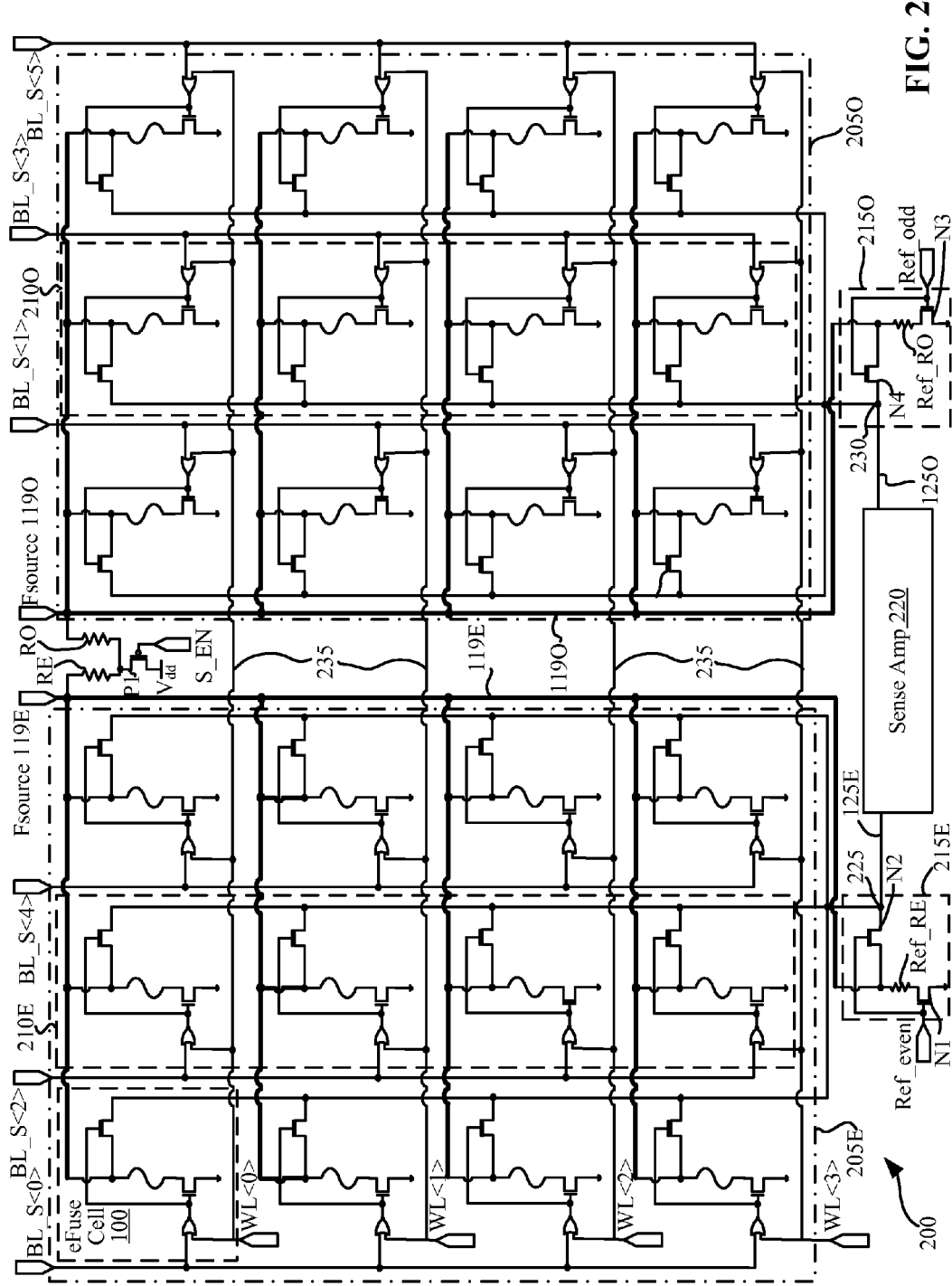
FIG. 2 is a schematic diagram of an eFuse cell array made up of the eFuse cells of FIG. 1 attached to an eFuse sense amplifier, according to an embodiment.

The first end of the eFuse 105 may be coupled to a node 130 and the second end of the eFuse 105 may be coupled to the first source/drain area of the blowFET 115. The second source/drain area of the blowFET 115 may be coupled to a voltage source. The voltage source may be ground. The first gate of the blowFET 115 may be coupled to a node 135. Node 135 may be coupled to the gate of the senseFET 110 and to the output of the eFuse select logic 120. The first input of eFuse select logic 120 may be a bitline select signal BL_S and the second input of the eFuse select logic 120 may be a wordline select signal WL_S. Node 130 may also be coupled to the third source/drain of the senseFET 110 and to a signal Fsource 119. Fsource may be referred to as an operation signal, which may include the operations an eFuse program (blow) signal and an eFuse sense signal described below. The fourth source/drain area of senseFET 110 may be coupled to a bitline 125, which may be coupled to a sense amplifier 220 (FIG. 2). When both BL_S and WL_S are active low to select the eFuse cell 100, Fsource 119 may be activated to either sense the state of the eFuse 105 or to program the eFuse 105 by blowing it with a higher current than the sense signal.

Referring now to FIG. 2, a circuit diagram is illustrated of an exemplary eFuse cell array 200, according to an embodiment. The eFuse cell array 200 may include an even eFuse cell array 205E and an odd eFuse cell array 205O. The even eFuse cell array 205E may include one or more even bitline columns 210E that are made up of one or more eFuse cells 100. Likewise, the odd eFuse cell array 205O may include one or more odd bitline columns 210O that are made up of one or more eFuse cells 100. Bitline columns 210O and 210E may be generally referred to as bitline columns 210. For simplicity, six bitline columns 210 are illustrated although any number of bitlines columns 210 may be considered.

Each bitline column 210 has bitline select signals referenced from BL_S<0> to BL_S<5>. The bitline select signals BL_S<0>-BL_S<5> signal their respective bitline columns 210 at the first input of the eFuse select logic 120. The rows of eFuse cells 100 may be coupled to a wordline 235. The eFuse cell array 200 illustrated has four wordlines 235; however the eFuse cell array 200 may have any number of wordlines 235. Wordlines 235 are coupled to the second inputs of the eFuse select logic 120 of the respective eFuse cells 100. Wordline select signals referenced from WL_S<0> to WL_S<3> may signal the second inputs of the eFuse select logic 120. In this example, an active low signal WL_S and BL_S may select an eFuse cell 100 in the array 200 for eFuse blowing or state sensing operations.

An even bitline 125E of the even eFuse cell array 205E may be coupled to an even reference resistor cell 215E and a sense amplifier 220 at a node 225. An odd bitline 125O of the odd eFuse cell array 205O may be coupled to an odd reference resistor cell 215O and the sense amplifier 220 at a node 230. The even reference resistor cell 215E may include reference resistor Ref_RE having a first end and a second end and nFETs N1 and N2. A reference resistor Ref_RE may be coupled at the first end to N2, as shown in FIG. 2, and an even Fsource 119E signal. The second end of the reference resistor Ref_RE may be coupled to N1 as shown in FIG. 2. As shown in FIG. 2, N1 may be coupled to ground. The gate of N1 may be coupled to an even resistance reference select signal Ref_even. Ref_even may also be coupled to the gate of N2. N2 may be coupled to the even bitline 125E and the sense amplifier 220 as shown. Ref_even may be signaled when a sense operation of an odd eFuse cell 100 is performed. The sense amplifier 220 generally compares the resistance of the even reference resistor Ref_RE to the resistance of an odd eFuse 105 of the selected eFuse cell 100 by comparing voltages to determine whether the eFuse 105 is blown or not. The sense amplifier 220 will be discussed further below in FIG. 3.

An odd reference resistor cell 215O may include a reference resistor Ref_RO having a first end and a second end and nFETs N3 and N4 each having a gate, source, and drain. The reference resistor Ref_RO may be coupled at the first end to N4 and a signal odd Fsource 119O. The second end of the reference resistor Ref_RO may be coupled to N3 as shown in FIG. 2. N4 may be coupled to ground as shown. The gate of N3 may be coupled to odd resistance reference select signal Ref_odd. Ref_odd may also be coupled to the gate of N4. N3 may be coupled to the odd bitline 125O and the sense amplifier 220 as shown in FIG. 2. Ref_odd may be signaled when a sense operation of an even eFuse cell 100 is performed. The sense amplifier 220 generally compares the resistance of the odd reference resistor Ref_RO to the resistance of an even eFuse 105 of the selected eFuse cell 100 through voltages to determine whether the eFuse 105 is blown or not. An exemplary reference resistor may have a resistance of 1 kilo-ohm.

Fsource 119E and 119O may be signals VPRG or Vdd minus an IR drop across pull-up resistors RE and RO respectively. VPRG may be a programming voltage that is active when performing a blow operation of an eFuse 105. Shown in FIG. 3, VPRG may be controlled by transmission gates 315E and 315O. Vdd may be a supply voltage for a sense operation of an eFuse 105. Vdd may be controlled by a pFET P1. The source of P1 may be coupled to Vdd while the drain may be coupled to a first end of an even pull-up resistor RE and a first end of an odd pull-up resistor RO. The gate of P1 may be signaled by a sense enable signal S_EN which is signaled active low for enabling the sense operation. For simplicity the transmission gates 315E and 315O (FIG. 3) and P1 are treated as perfect switches in explaining what signals in which Fsource is derived. Also, Fsource may be a floating VPRG and Vdd.

Figure 3:
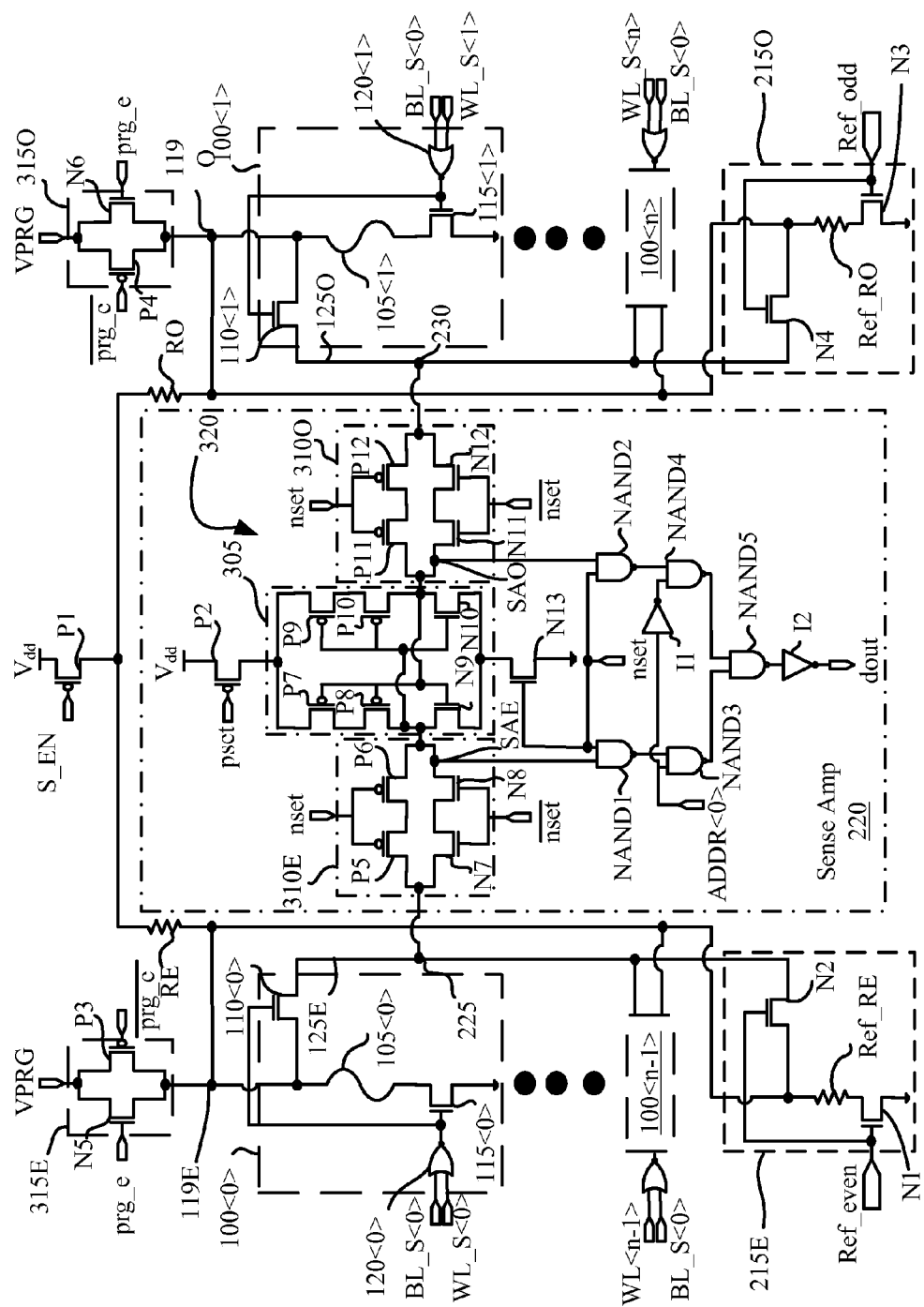
FIG. 3 is a schematic diagram illustrating an exemplary eFuse sense amplifier of FIG. 2 for implementing eFuse resistance measurement of the eFuse cells, according to an embodiment.

Referring now to FIG. 3, a schematic diagram is illustrated of a sense amplifier 220. The sense amplifier 220 may include even and odd bitlines 125E, 125O. The bitlines 125E, 125O may be coupled to the sense amplifier 220 at nodes 225 and 230, respectively. On the even side of the sense amplifier 220 there may be the even reference resistor cell 215E coupled to the sense amplifier 220 at node 225. On the odd side of the sense amplifier 220 there may be the odd reference resistor cell 215O coupled to the sense amplifier 220 at node 230.

The sense amplifier 220 may include an even transmission gate 310E defined by a parallel connected pair of series connected pFETs P5, P6 and pair of series connected nFETs N7, N8 coupled to the even bitline 125E at node 225 and an even sensing node SAE. The pFETs P5, P6 may receive a gate input control signal nset and the nFETs N7, N8 may receive an inverse gate input control signal $\overline{nset}$. P5 and P6, and N7 and N8 are series connected to protect against the capacitive coupling from the bitline 125E to the sense amplifier 220 that may cause data overwrites.

The sense amplifier 220 may include an odd transmission gate 310O defined by a parallel connected pair of series connected pFETs P11, P12 and pair of series connected nFETs N11, N12 coupled to the odd bitline 125O at node 230 and an odd sensing node SAO. The pFETs P11, P12 may receive a gate input control signal nset and the nFETs N11, N12 may receive an inverse gate input control signal $\overline{nset}$. The FETs P11 and P12, and N11 and N12 are series connected to protect against the capacitive coupling from the odd bitline 125O to the sense amplifier 220.

As shown in FIG. 3, the eFuse cell array 200 includes, for example, an n-bit bitline column of eFuse cells 100<0>-100<n> coupled to the bitlines 125E, 125O on each side of the sense amplifier 220. Some bitline columns 210 are 32 bits or 64 bits, for example. As shown in FIG. 3, each of the eFuses cells 105 on a bitline receive a respective wordline select signal WL_S<0:n>. Even eFuse cells from an eFuse cell 100<0> receiving a wordline select signal WL_S<0> to an eFuse cell 100<n−1> receiving a wordline select signal WL_S<n−1> are coupled to the even bitline 125E. The odd eFuse cells from eFuse cell 100<1> receiving a wordline select signal WL_S<1> to eFuse cell 100<n> receiving a wordline select signal WL_S<n> are coupled to the odd bitline 125O. Each eFuse cell 100<0>-100<n> may receive a bitline select signal BL_S<0>.

Furthermore, each eFuse cell 100 may be coupled to Fsource 119, e.g., Fsource 119E for even eFuse cells and Fsource 119O for odd eFuse cells. Fsource 119E includes the even pull-up resistor, referenced as RE, with a first end coupled to the even bitline 125E. Fsource 119O includes the odd pull-up resistor, referenced as RO, with a first end coupled to the odd bitline 125O. The pull-up resistors RE and RO are coupled at their second ends to a pFET P1 receiving the gate input control signal sense enable S_EN. P1 is coupled to Vdd as shown in FIG. 3. Each respective pull-up resistor RE and RO has a predetermined resistor value, such as 3 kilo-ohm.

An example of a voltage calculation may illustrate a sense operation of an odd eFuse 105. At node 225, the voltage will be Vdd*(Ref_RE/(Ref_RE+RE)). At node 230, the voltage will be Vdd*(eFuse Resistance/(eFuse Resistance+RO)). An unblown eFuse 105 may have a resistance of 100 ohms, RE and RO may have a resistance of 3 kilo-ohms, and Ref_RE may have a resistance of 1 kilo-ohms. If Vdd is 1V, then the voltage at node 225 is 0.25V and the voltage at node 230 is about 0.09V. The sense amplifier 220 may amplify the voltages and determine which voltage is larger. If the reference voltage is greater than the eFuse cell 105 voltage, then the eFuse cell 105 is unblown. If the eFuse cell 105 voltage is greater than the reference voltage, then the eFuse cell 105 is blown.

As stated before, Fsource 119E or 119O may be the output of the transmission gates 315E and 315O, respectively, which is derived from a blow programming voltage VPRG. Transmission gate 315E may have an nFET N5 receiving a gate input program enable signal prg_e and a pFET P3 receiving a gate input inverse program enable signal $\overline{prg\_e}$. Similarly, transmission gate 315O may have an nFET N6 receiving a gate input program enable signal prg_e and a pFET P4 receiving a gate input inverse program enable signal $\overline{prg\_e}$. Transmission gates 315E and 315O and blowFET 115 (FIG. 1) must be switched to conduct current from VPRG to blow eFuse 105.

Sense amplifier 220 may include a sensing circuit generally designated by reference number 320 coupled to the sensing nodes SAE, SAO including a header pFET P2 coupled between the voltage supply Vdd and a pair of cross-coupled inverters 305. A pair of series connected pFETs P7, P8 and an nFET N9, and a pair of series connected pFETs P9, P10 and an NFET N10, respectively, may form the cross-coupled inverters 305. Sensing circuit 320 may include a pull-down nFET N13 coupling nFET sources N9, N10 to ground when nset is enabled. A signal pset may control P2, which may be enabled before nset during the sense operation.

Logic gates NAND1 and NAND2 may be coupled to the respective sensing nodes SAE, SAO and may include a second input connected to the control input nset. The NAND1 and NAND2 may provide output their signal to a first input of a NAND3 and NAND4, respectively. The second input of NAND3 may be an address signal ADDR<0> and the second input of NAND4 may be an inverted ADDR<0> signal from inverter I1 The output of NAND3 and NAND4 may be applied to a respective first and second input of a logic gate NAND5. The output of NAND5 may be applied to an inverter I2 driving an output signal dout from the sense amplifier 220.

Having the architecture of the eFuse cell 100, as described, may reduce the resistance during a blow operation from the program (blow) voltage VPRG to the eFuse cell 100. The resistance may be reduced because the program voltage power may be gridded over the core of the eFuses 105 instead of having to follow the bitlines 125E, 125O. Additionally, the architecture of the eFuse cell 105 provides for only transient currents through bitlines 125E and 125O, thereby eliminating DC effects of bitlines during a sense operation.

Figure 4:
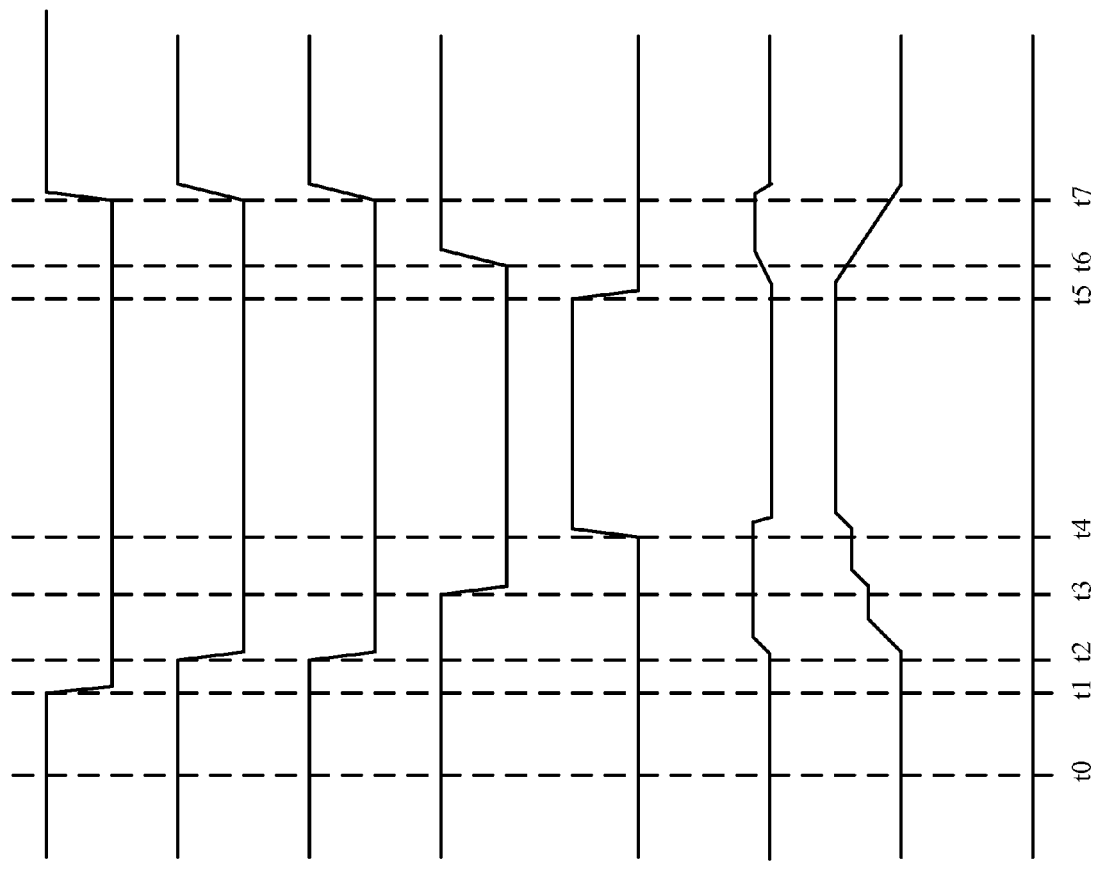
FIG. 4 is a an exemplary timing chart of a sense operation of an unblown eFuse, according to an embodiment

Referring to FIG. 4, a timing diagram of an eFuse 105 sense operation is illustrated, according to an embodiment. The timing diagram illustrates a sense operation of an unblown eFuse 105 of eFuse cell 100<0>. At time t0, the eFuse cell array 200 may be at steady-state. S_EN may be inactive high. WL_S<0> and BL_S<0> may both be inactive high. The signal pset may be inactive high and the signal nset may be inactive low. SAE and SAO may be both low. The output from the sense amplifier 220 dout may be low. At time t1, the sense operation may begin when the sense enable signal S_EN transitions from high to active low.

At time t2, the eFuse 105 may be signaled to be sensed when both WL_S<0> and BL_S<0> transition from high to low. In the case of an unblown eFuse 100, the voltage of SAE may only rise slightly. The voltage of SAO may rise higher than SAE due to the reference resistor Ref_RO having a higher resistance than the unblown eFuse 105<0>.

At time t3, pset may be signaled transitioning from inactive high to active low. Activating pset may cause the voltage of signal SAO to rise.

At time t4, nset may transition from inactive low to active high. Activating nset may cause SAE to go to ground and allow the voltage of SAO to rise to Vdd. Activating nset may also allow the sense amplifier 220 to compare the resistance of the eFuse 105<0> to the reference resistor Ref_O to determine whether the eFuse 105<0> is blown or not. If the eFuse 105<0> is unblown, then the output of dout (FIG. 3) may be inactive low as in the timing diagram illustrated in FIG. 4. If the eFuse 105<0> is blown, then the output of dout may be active high.

At time t5, nset may transition from high to low beginning the sense operation reset process. This may cause the voltage of SAE to rise slightly and SAO to begin transitioning from high to low. Shortly after nset transitions low, at time t6, pset may be signaled to begin transitioning from low to high At time t7, WL_S<0> and BL_S<0> may transition from low to high causing SAE and SAO to signal low. At t7, S_EN may also transition from low to high to complete the sense operation.

Figure 5:
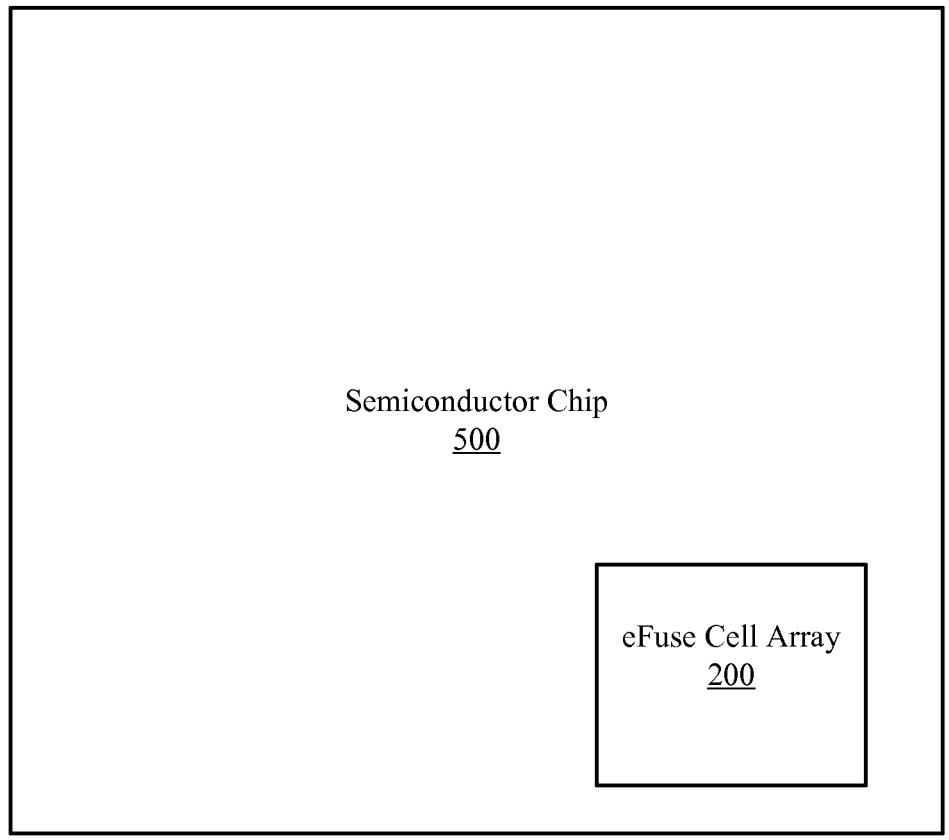
FIG. 5 is a block diagram of a semiconductor chip including the eFuse cell array of FIG. 2, according to an embodiment.

Referring to FIG. 5, a block diagram of an exemplary semiconductor chip 500 is illustrated, according to an embodiment. The semiconductor chip may include the eFuse cell array 200.

While the Detailed Description may refer to specific types of transistors, logic gates, supply voltages, and the like it will be appreciated that one skilled in the art may implement same or similar functions using different transistors, logic gates, and supply voltages in alternative embodiments as described and still accomplish the same purpose of the invention. For example, transistors may be PFETs or NFETs. Logic gates may be AND, OR, XOR, NOR, NAND, XNOR or inverters. Therefore, the scope of the invention should not be limited.

Figure 6:
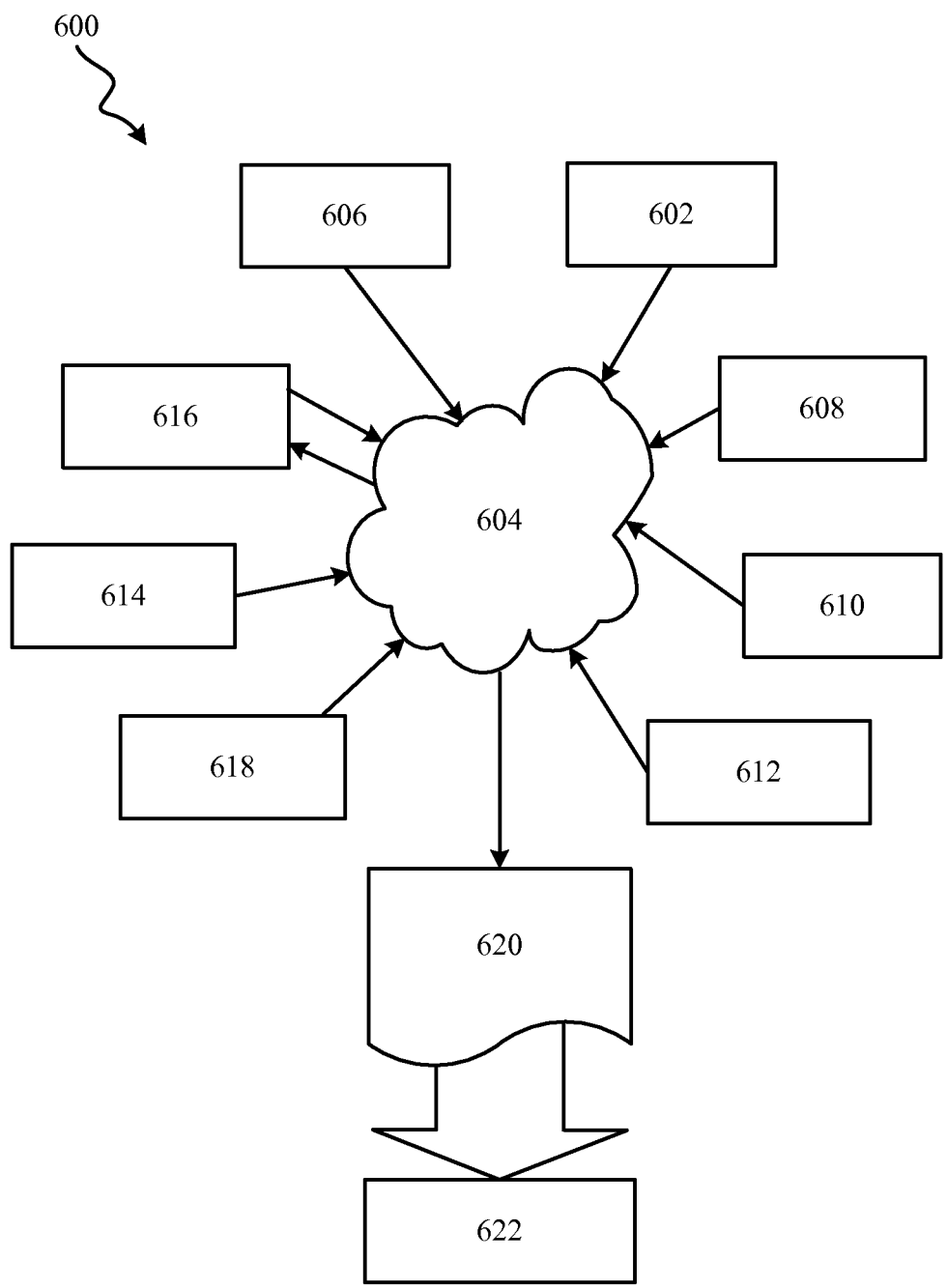
FIG. 6 is a flow diagram of a design process used in semiconductor design, manufacturing, and testing, according to an embodiment.

FIG. 6 shows a block diagram of an example design flow 600 that may be used for the eFuse cell 100 described herein. Design flow 600 may vary depending on the type of integrated circuit (IC) being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises eFuse cell 100 or eFuse cell array 200 in the form of schematics or HDL, a hardware-description language, for example, Verilog, VHDL, C, and the like. Design structure 602 is tangibly contained on, for example, one or more machine readable storage medium, such as: a magnetic tape, CD-ROM, a flash drive, a hard disk, or other tangible computer readable storage medium. For example, design structure 602 may be a text file or a graphical representation of eFuse cell 100 or eFuse cell array 200. Design process 604 preferably synthesizes, or translates, eFuse cell 100 or eFuse cell array 200 into a netlist 606, where netlist 606 is, for example, a list of wires, transistors, logic gates, control circuits, I/O, models, etc. that describes the connections to other elements and circuits in an integrated circuit design and recorded on at least one of machine readable storage medium. This may be an iterative process in which netlist 606 is resynthesized one or more times depending on design specifications and parameters for the circuit.

Design process 604 may include using a variety of inputs; for example, inputs from library elements 608 which may house a set of commonly used elements, circuits, and devices, including models, layouts, and symbolic representations, for a given manufacturing technology, such as different technology nodes, 32 nm, 46 nm, 90 nm, and the like, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment as shown in FIGS. 1-5 along with any additional integrated circuit design or data (if applicable), into a second design structure 620. Design structure 620 resides on a machine readable storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment as shown in FIGS. 1-5. Design structure 620 may then proceed to a stage 622 where, for example, design structure 620 proceeds to tape-out, is released to manufacturing, is released to a mask house, is sent to another design house, is sent back to the customer, and the like.

While embodiments have been described with reference to the details of the embodiments shown in the drawings, these details are not intended to limit the scope of the disclosure as claimed in the appended claims.

What is claimed is:

1. An eFuse array comprising:
an odd eFuse array and an even eFuse array;
the odd eFuse array comprising:
  an odd eFuse cell,
  an odd blowFET coupled between a first end of an odd eFuse of the odd eFuse cell and ground,
  an odd senseFET coupled between a second end of the odd eFuse and an odd bit line, wherein the odd bit line is coupled to both a sense amplifier and an odd reference resistor,
  a gate of the odd blowFET and a gate of the odd senseFET coupled to an odd control signal, and
  the second end of the odd eFuse coupled to an odd current source, wherein the odd current source:
    provides an odd blow current to blow the odd eFuse during programming, provides an odd sense current when sensing the odd eFuse, wherein the odd current source does not flow through the odd bit line, and the odd current source flows through the odd reference resistor when the even eFuse array is selected; and the even eFuse array comprising:

an even eFuse cell, an even blowFET coupled between a first end of an even eFuse of the even eFuse cell and ground, an even senseFET coupled between a second end of the even eFuse and an even bit line, wherein the even bit line is coupled to both the sense amplifier and an even reference resistor, a gate of the even blowFET and a gate of the even senseFET coupled to an even control signal, and the second end of the even eFuse coupled to an even current source, wherein the even current source:

provides an even blow current to blow the even eFuse during programming, provides an even sense current when sensing the even eFuse, wherein the even sense current does not flow through the even bit line, and the even current source flows through the even reference resistor when the odd eFuse array is selected.

2. The eFuse array of claim 1, wherein the odd control signal is a logical combination of an odd bitline select and a wordline.

3. The eFuse array of claim 1, wherein the even control signal is a logical combination of an even bitline select and a wordline.

4. The eFuse array of claim 1, wherein the odd eFuse array includes a plurality of odd eFuse cells arranged in rows and columns, and the even eFuse array includes a plurality of even eFuse cells arranged in rows and columns.

5. The eFuse array of claim 1, wherein the sense amplifier is configured to:

sense a first voltage on the odd eFuse, and compare the first voltage with a second voltage of the even reference resistor; and sense a third voltage on the even eFuse, and compare the third voltage with a fourth voltage of the odd reference resistor.

6. A design structure embodied in a machine readable medium used in a design process, the design structure comprising:

an odd eFuse array and an even eFuse array;

the odd eFuse array comprising:

an odd eFuse cell, an odd blowFET coupled between a first end of an odd eFuse of the odd eFuse cell and ground, an odd senseFET coupled between a second end of the odd eFuse and an odd bit line, wherein the odd bit line is coupled to both a sense amplifier and an odd reference resistor, a gate of the odd blowFET and a gate of the odd senseFET coupled to an odd control signal, and the second end of the odd eFuse coupled to an odd current source, wherein the odd current source:

provides an odd blow current to blow the odd eFuse during programming, provides an odd sense current when sensing the odd eFuse, wherein the odd current source does not flow through the odd bit line, and the odd current source flows through the odd reference resistor when the even eFuse array is selected; and the even eFuse array comprising:

an even eFuse cell, an even blowFET coupled between a first end of an even eFuse of the even eFuse cell and ground, an even senseFET coupled between a second end of the even eFuse and an even bit line, wherein the even bit line is coupled to both the sense amplifier and an even reference resistor, a gate of the even blowFET and a gate of the even senseFET coupled to an even control signal, and the second end of the even eFuse coupled to an even current source, wherein the even current source:

provides an even blow current to blow the even eFuse during programming, provides an even sense current when sensing the even eFuse, wherein the even sense current does not flow through the even bit line, and the even current source flows through the even reference resistor when the odd eFuse array is selected.

7. The design structure of claim 6, wherein the odd control signal is a logical combination of an odd bitline select and a wordline.

8. The design structure of claim 6, wherein the even control signal is a logical combination of an even bitline select and a wordline.

9. The design structure of claim 6, wherein the odd eFuse array includes a plurality of odd eFuse cells arranged in rows and columns, and the even eFuse array includes a plurality of even eFuse cells arranged in rows and columns.

10. The design structure of claim 6, wherein the sense amplifier is configured to:

sense a first voltage on the odd eFuse, and compare the first voltage with a second voltage of the even reference resistor; and sense a third voltage on the even eFuse, and compare the third voltage with a fourth voltage of the odd reference resistor.

11. A method for assembling an eFuse array, the method comprising:

structuring an odd eFuse array and an even eFuse array;

the odd eFuse array comprising:

an odd eFuse cell, an odd blowFET coupled between a first end of an odd eFuse of the odd eFuse cell and ground, an odd senseFET coupled between a second end of the odd eFuse and an odd bit line, wherein the odd bit line is coupled to both a sense amplifier and an odd reference resistor, a gate of the odd blowFET and a gate of the odd senseFET coupled to an odd control signal, and the second end of the odd eFuse coupled to an odd current source, wherein the odd current source:

provides an odd blow current to blow the odd eFuse during programming, provides an odd sense current when sensing the odd eFuse, wherein the odd current source does not flow through the odd bit line, and the odd current source flows through the odd reference resistor when the even eFuse array is selected; and the even eFuse array comprising:
an even eFuse cell,
an even blowFET coupled between a first end of an even eFuse of the even eFuse cell and ground,
an even senseFET coupled between a second end of the even eFuse and an even bit line, wherein the even bit line is coupled to both the sense amplifier and an even reference resistor,
a gate of the even blowFET and a gate of the even senseFET coupled to an even control signal, and
the second end of the even eFuse coupled to an even current source, wherein the even current source:
provides an even blow current to blow the even eFuse during programming,
provides an even sense current when sensing the even eFuse,
wherein the even sense current does not flow through the even bit line, and
the even current source flows through the even reference resistor when the odd eFuse array is selected.

12. The method of claim 11, wherein the odd control signal is a logical combination of an odd bitline select and a wordline.

13. The method of claim 11, wherein the even control signal is a logical combination of an even bitline select and a wordline.

14. The method of claim 11, wherein the odd eFuse array includes a plurality of odd eFuse cells arranged in rows and columns, and the even eFuse array includes a plurality of even eFuse cells arranged in rows and columns.

15. The method of claim 11, further comprising:
detecting, by the sense amplifier, a first voltage on the odd eFuse;
comparing the first voltage with a second voltage of the even reference resistor;
detecting, by the sense amplifier, a third voltage on the even eFuse; and
comparing the third voltage with a fourth voltage of the odd reference resistor.

\* \* \* \* \*